US007570778B2

(12) United States Patent
Wright

(10) Patent No.: US 7,570,778 B2
(45) Date of Patent: Aug. 4, 2009

(54) ANGLED SPEAKER ASSEMBLY

(76) Inventor: Doug S. Wright, 3554 Quincy Ave., Simi Valley, CA (US) 93063

( * ) Notice: Subject to any disclaimer, the term of this patent is extended or adjusted under 35 U.S.C. 154(b) by 881 days.

(21) Appl. No.: 10/871,111

(22) Filed: Jun. 18, 2004

(65) Prior Publication Data

US 2005/0047604 A1 Mar. 3, 2005

Related U.S. Application Data

(60) Provisional application No. 60/497,752, filed on Aug. 26, 2003.

(51) Int. Cl.
*H04R 1/02* (2006.01)
*H04R 9/06* (2006.01)
*H05K 5/00* (2006.01)

(52) U.S. Cl. ....................... 381/387; 381/336; 381/395; 181/150

(58) Field of Classification Search .................. 381/87, 381/387, 336, 386, 391, 395, 433; 181/150
See application file for complete search history.

(56) References Cited

U.S. PATENT DOCUMENTS 4,917,212 A * 4/1990 Iwaya ......................... 181/141
5,143,339 A 9/1992 Ashcraft et al.
D340,718 S 10/1993 Leger et al.
5,734,732 A * 3/1998 Lemmon .................... 381/386
5,867,583 A 2/1999 Hazelwood et al.
5,952,619 A 9/1999 Kantor et al.
D419,561 S 1/2000 Haase et al.
6,026,927 A * 2/2000 Burdett et al. .............. 181/144
6,070,694 A 6/2000 Burdett et al.
6,101,262 A 8/2000 Haase et al.
6,375,142 B1 4/2002 Miller et al.
D461,464 S 8/2002 Sterns et al.
D475,364 S 6/2003 Sterns et al.
6,683,963 B2 1/2004 Sterns et al.
6,766,027 B2 * 7/2004 Ryan et al. .................. 381/182
6,925,190 B2 * 8/2005 Popken et al. ............... 381/395
7,171,013 B2 * 1/2007 Kosatos et al. .............. 381/182

* cited by examiner

*Primary Examiner*—Curtis Kuntz
*Assistant Examiner*—Jesse A Elbin
(74) *Attorney, Agent, or Firm*—Julio M. Loza; Loza & Loza, LLP

(57) ABSTRACT

A speaker frame that can be rotated to adjust the direction and/or angle of sound dispersion of a speaker mounted therein. One embodiment of the invention includes a recessed speaker frame with an angled flange mounted on an angled ridge. The angled flange rides on the angled ridge to cause the angle of the speaker frame to change, relative to a mounting surface, within a range of angles. The range of angles defined by the maximum cumulative angle of the flange and angled ridge.

16 Claims, 9 Drawing Sheets

ANGLED SPEAKER ASSEMBLY

CROSS REFERENCE TO RELATED APPLICATIONS

This non-provisional United States (U.S.) Patent Application claims the benefit of provisional U.S. Patent Application No. 60/497,752, filed Aug. 26, 2003, and is related to U.S. patent application Ser. No. 10/871,069 filed on Jun. 18, 2004 by inventor Doug S. Wright, titled "Snap-In and Lock Baffle", and is also related to U.S. patent application Ser. No. 10/871,112 filed on Jun. 18, 2004 by inventor Doug S. Wright, titled "Tool-less Frame Fastening System."

FIELD

Various embodiments of the invention pertain to speaker mountings and housings. More particularly, at least one embodiment of the invention relates to a device, system, and method for a speaker assembly that permits adjusting the dispersion axis of a recessed speaker.

DESCRIPTION OF RELATED ART

In order to save space and/or for aesthetic reasons it is often desirable to mount speakers within a wall or ceiling cavity or recess. A mounting assembly is commonly used to secure the speakers to the wall or ceiling. Various types of frames and fasteners are often used for the purpose of securing the speaker to the wall or ceiling cavities.

A speaker mounted in a wall or ceiling using a conventional frame assembly typically has a sound dispersion axis that is perpendicular to the plane formed by the mounting surface, e.g., wall or ceiling. However, speakers with sound dispersion axes directed at the floor or an opposing wall often do not provide an environment with optimum sound quality. Thus, when installing one or more speakers in a room, it is often desirable to adjust the angle of one or more of the speakers to provide a better sound quality or effect.

It is often necessary or desirable to adjust the direction in which, for instance, a ceiling-mounted speaker radiates sound. For example, when providing a surround sound effect with one or more recessed speakers, the sound dispersion axis of the speakers is adjusted to provide optimum sound quality at a given point or location in the room.

However, conventional speaker mounting systems make it difficult to adjust the sound dispersion axis of a speaker to provide an optimum sound quality. For example, many conventional speakers are fixedly mounted in a wall or ceiling recess and cannot be adjusted. Additionally, even when adjustments to the speakers are possible, prior art mounting mechanisms are typically restricted to a limited number of positions. This may not always permit directing a speaker's sound dispersion axis to obtain the best sound quality in a particular room or environment.

Even when the speakers can be adjusted, they are often difficult and/or cumbersome to readjust at a later time. This may be necessary, for instance, in a surround sound speaker configuration that has been setup for optimal sound quality at a first location and now the optimal sound quality is desired at a second location. Such is the case, for example, when a couch is moved from a first location to a second location in a room. Readjusting conventional speakers is typically requires removal and reinstallation of the speaker and/or speaker mounting assembly which is undesirable and costly.

SUMMARY

One embodiment of the invention relates to a speaker mounting assembly including a speaker frame defining a housing to receive a speaker. The speaker frame has a first plane along the face of the speaker frame. The speaker frame includes a flange around the perimeter of the speaker frame, the flange defines a second plane that is at an angle to the first plane. The speaker frame also includes a baffle which defines an interior opening to receive the speaker frame and a third plane along the face of the baffle. The baffle includes an angled ridge along the perimeter of the interior opening, the ridge defining a fourth plane that is at an angle to the third plane, the ridge defining a perimeter that is smaller than the perimeter defined by the flange. The ridge to support the flange when the speaker frame is coupled to the baffle. A clamp frame is coupled to the baffle to secure the speaker frame between the baffle and the clamp frame while permitting the speaker frame to rotate about a first axis perpendicular to the first plane. The angle of the first plane of the speaker frame, relative to the third plane of the baffle, being adjustable within a range by rotating the speaker frame about the first axis.

The speaker mounting assembly includes a groove that is formed by the clamp frame and the ridge when the clamp is coupled to the baffle. The flange slides within this groove when the speaker frame is rotated about the first axis. The baffle further includes a grooved channel along a first section defining the interior opening, the grooved channel to receive a stop pin coupled to the flange and limit the rotation of the speaker frame to the first section.

As a result of this construction, the speaker frame assembly is capable of being adjusted to any angle, relative to the third plane of the baffle, between a minimum angle and a maximum angle by rotating the speaker frame assembly about the first axis.

DETAILED DESCRIPTION

In the following description numerous specific details are set forth in order to provide a thorough understanding of the invention. However, one skilled in the art would recognize that the invention may be practiced without these specific details. In other instances, well known methods, procedures, and/or components have not been described in detail so as not to unnecessarily obscure aspects of the invention.

In the following description, certain terminology is used to describe certain features of one or more embodiments of the invention. For instance, "fastener" and "retainer" are interchangeably used to refer to any type of securing mechanism. The term "speaker" is used to refer to any type of sound-generating device such as audio electronic equipment, loudspeakers, audio speakers, woofers, subwoofers, audio mixers, tweeters, and acoustic transducers. The term "manually" refers to a motion or task performed by hand and without the aid of a tool.

One aspect of the invention provides a speaker mounting assembly that permits positioning the sound dispersion axis of a recessed speaker in any direction and at any desired angle within a range of angles. Another aspect of the invention permits manually readjusting the direction and angle of a speaker without removal of the speaker.

Figure 1:
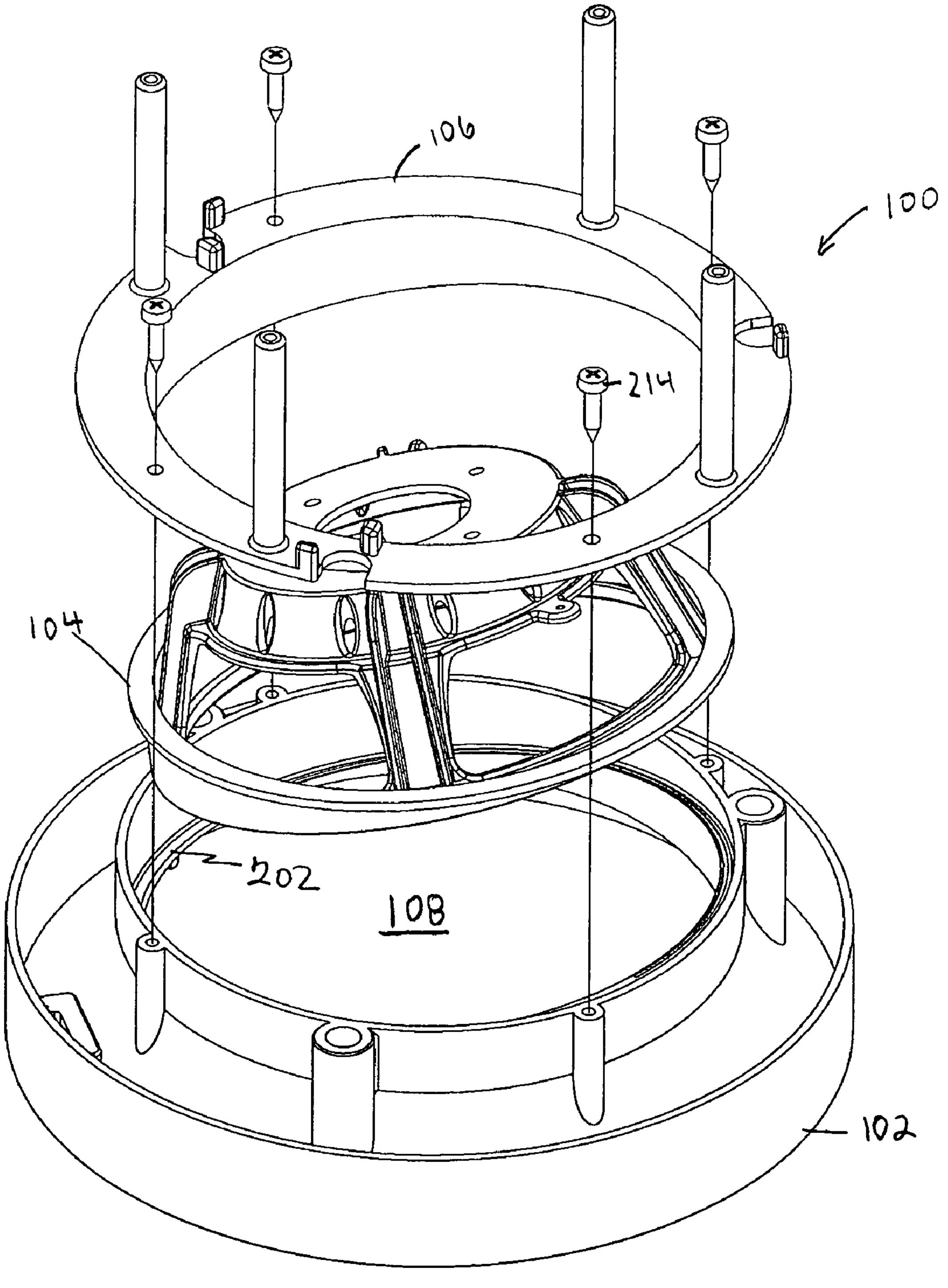
FIG. 1 illustrates an exploded perspective view of a speaker mounting assembly according to one embodiment of the invention.

FIG. 1 illustrates an exploded perspective view of a speaker mounting assembly 100 according to one embodiment of the invention. The speaker mounting assembly 100 includes a rotating baffle 102, a speaker frame 104, and a speaker frame clamp 106. The rotating baffle 102 is rotationally mounted and secured to a mounting assembly, typically, within a wall or ceiling recess. The baffle 102 also includes an opening 108 to permit sounds from a speaker mounted on the speaker frame 104 to propagate. The speaker frame 104 may house an audio speaker and is rotationally secured to the rotating baffle 102 by the frame clamp 106.

Figure 2:
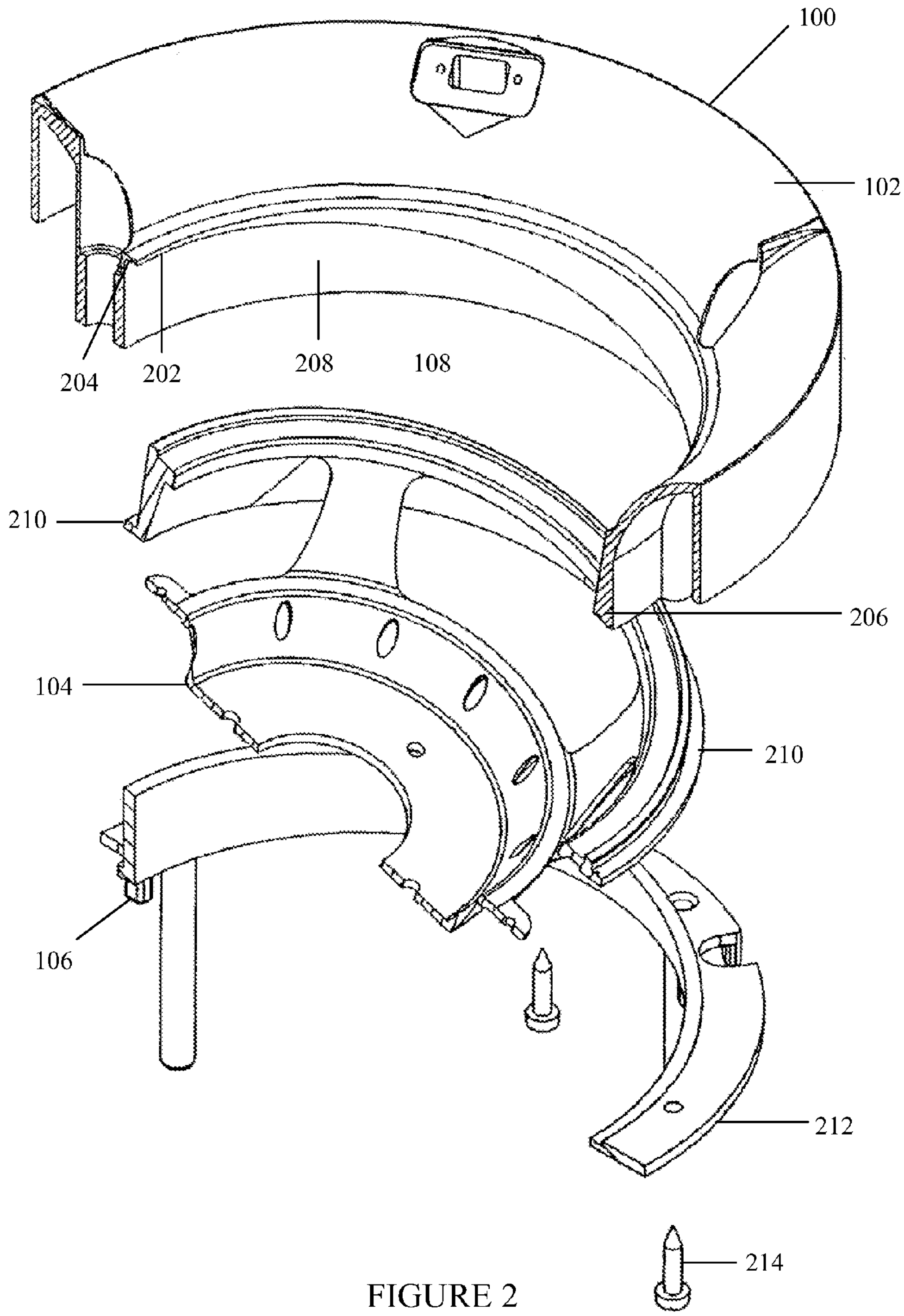
FIG. 2 illustrates a perspective cross-sectional view of the speaker mounting assembly of FIG. 1 according to one embodiment of the invention.

FIG. 2 illustrates a perspective cross-sectional view of the speaker mounting assembly of FIG. 1 according to one embodiment of the invention. The baffle 102 includes a ridge 202 angled from a first end 204 to a second end 206 of the interior vertical wall 208 defining the opening 108. That is, the ridge 202 extends all the way around the interior vertical wall 208 but at a different height along the wall 208. Consequently, the plane defined by the ridge 202 is at an angle to the planed defined by the face of the baffle.

The ridge 202 protrudes from the vertical wall 208 such that opening 108 has a slightly smaller diameter at the baffle 102 face than at the rear portion of the baffle 102. The opening 108 has a diameter large enough to permit the speaker frame 104 to be mounted therein. The ridge 202 slightly reduces the diameter of the opening 108 such that the speaker frame 104 rests on the ridge 202. This causes the speaker frame 104 to rest on the ridge 202 when the speaker mounting assembly is assembled. When resting against the ridge 202, the speaker frame 104 is able to slide on the ridge 202 and rotate within the baffle 102. The speaker frame 104 may include a flange 210, around the circumference of the frame, which slides against the ridge 202.

The speaker frame clamp 106 secures the frame assembly 104 to the baffle 102. One implementation of the speaker frame clamp 106 includes a securing ring 212 through which fasteners 214 may be placed to fixedly couple the frame clamp 106 to the baffle 102.

Figure 3:
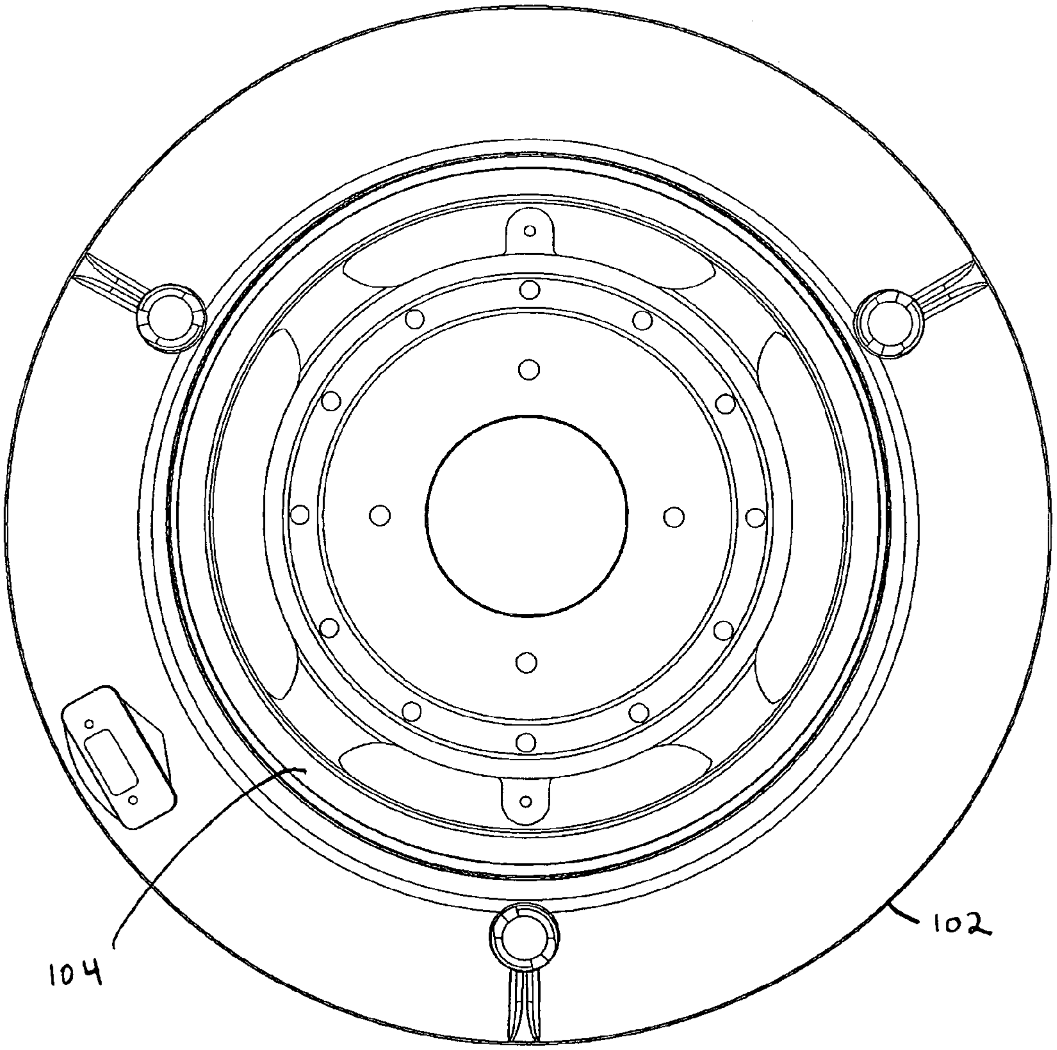
FIG. 3 illustrates a frontal view of the speaker mounting assembly of FIG. 1 according to one embodiment of the invention.

FIG. 3 illustrates a frontal view of the speaker mounting assembly of FIG. 1 according to one embodiment of the invention. The speaker frame 104 is inserted within the baffle 102 when the mounting assembly is assembled.

Figure 4:
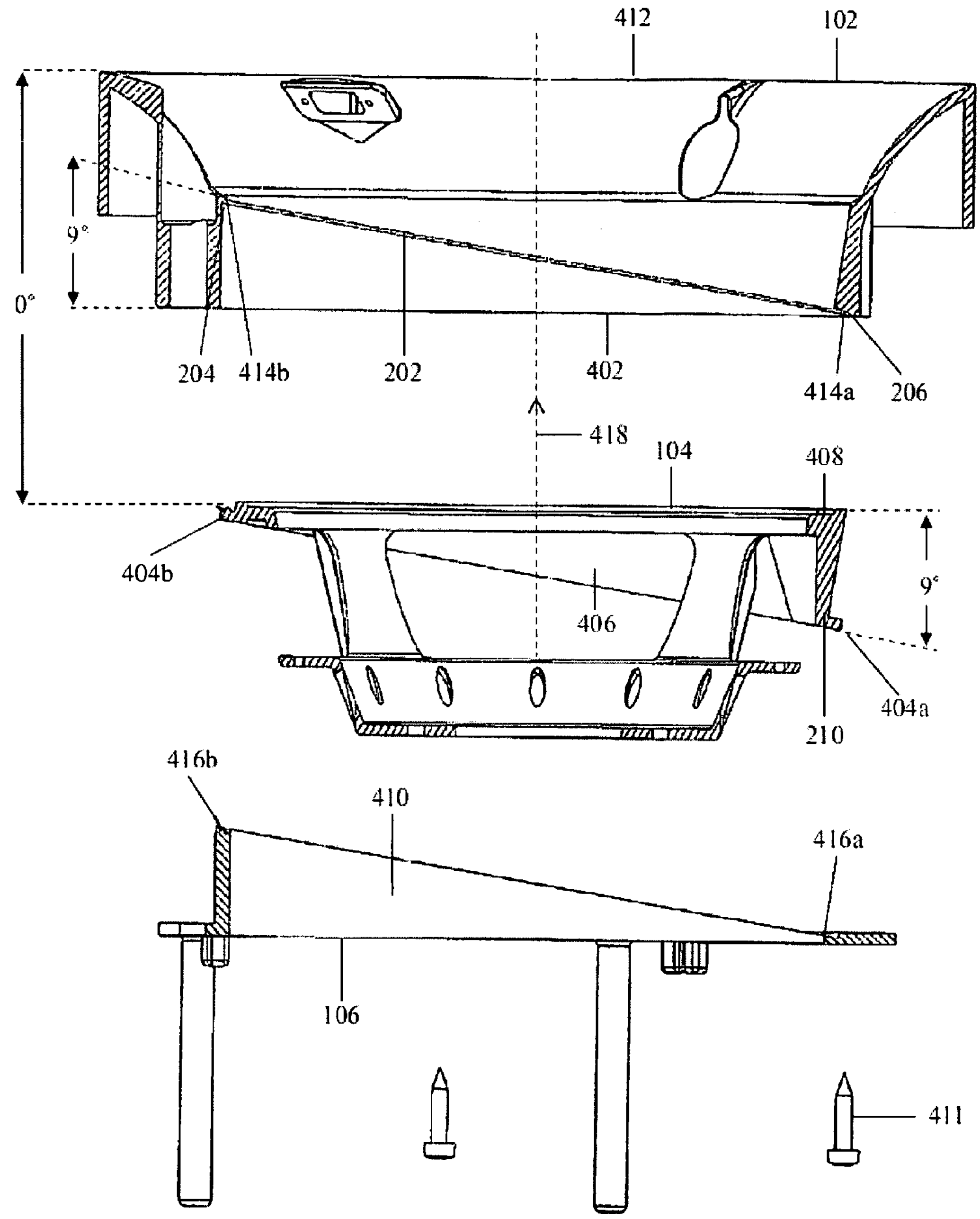
FIG. 4 illustrates an exploded sectional view of the speaker mounting assembly of FIG. 3 with the speaker frame in a first position according to one embodiment of the invention.

FIG. 4 illustrates an exploded sectional view of the speaker mounting assembly of FIG. 3 with the speaker frame in a first position according to one embodiment of the invention. This figure illustrates the orientation of the speaker frame 104 relative to the and baffle 102 in a first position. In this embodiment of the invention, the ridge 202 has an angle of approximately nine (9) degrees relative to the rear plane 402 of the speaker frame 104.

The speaker frame 104 also includes an angled flange 210 along the perimeter of a vertical wall 406. In one implementation of the invention the flange 210 is angled by making he vertical wall 406 higher at one than at a second end. Consequently, the plane defined by the flange 210 is at an angle relative to the plane defined by the speaker frame's face plane 408.

In one implementation, the angled flange 210 has the same angle as the ridge 202, (e.g., nine (9) degrees) relative to the face plane 408 of the speaker frame 104. When assembled, the speaker frame 104 is inserted into the baffle 102 so that the flange 210 sits on the ridge 202.

The speaker frame clamp 106 is then inserted into the baffle 102. In one implementation of the invention, the speaker frame clamp 106 includes an angled wall 410 with the same angle as the angled flange 210 of the speaker frame 104. When assembled, the speaker frame clamp 106 is inserted into the baffle 102 to retain the speaker frame 104 within the baffle 102. The angled wall 410 and the ridge 202 form a groove in which the speaker frame flange 210 can slide. One or more fasteners 411 serve to couple the speaker frame clamp 106 to the baffle 102.

FIG. 4 illustrates a first position or orientation of the speaker frame. In this position, the angle of the ridge 202 and the angle of the flange 410 substantially cancel each other such that the speaker frame face plane 408 is substantially parallel to the baffle face plane 412. When assembled, the speaker frame flange portion 404*a* rests against the ridge portion 414*a*. Similarly, speaker frame flange portion 404*b* rests against ridge portion 414*b*. The angled wall portions 416*a* and 416*b* are inserted adjacent to the speaker frame flange portions 404*a* and 404*b* respectively. In this position, a speaker mounted within the speaker frame 104 would have a sound dispersion axis 418 substantially perpendicular to the face of the face plane 412 of the baffle 408 mounting surface, e.g., wall or ceiling.

Figure 5:
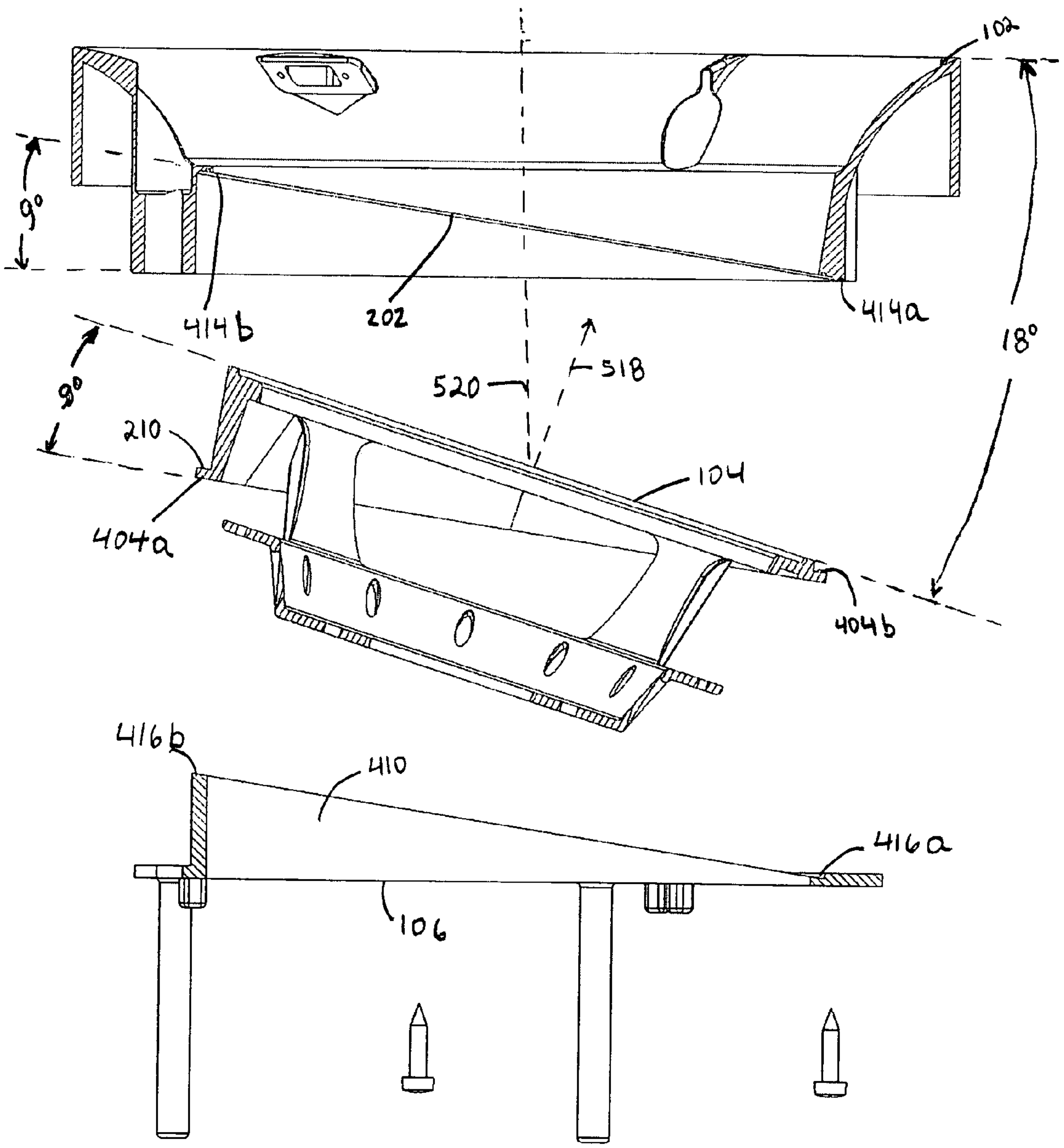
FIG. 5 illustrates an cross-exploded sectional view of the speaker mounting assembly of FIG. 3 with the speaker frame in a second position according to one embodiment of the invention.

FIG. 5 illustrates an exploded cross-sectional view of the speaker mounting assembly of FIG. 3 with the speaker frame in a second position according to one embodiment of the invention. In FIG. 5, the speaker frame 104 has been rotated one hundred and eighty (180) degrees from the position illustrated in FIG. 4 relative to the baffle 102. In this orientation, the angle of the ridge 202 and the angle of the flange 210 are cumulative such that the speaker frame face plane 408 is at an angle to the baffle face plane 412. For example, if the angle of the ridge 202 is nine (9) degrees and the angle of the flange 210 is nine (9) degrees, then the maximum angle that can be formed by the ridge 202 and flange 210 is eighteen (18) degrees.

In the FIG. 5, speaker frame flange portion 404*a* rests against ridge portion 414*b* while flange portion 404*b* rests against ridge portion 414*a*. In this position, a speaker mounted within the speaker frame 104 would have a sound dispersion axis 518 angled at eighteen (18) degrees from an axis 520 perpendicular to the mounting surface, e.g., wall or ceiling.

As a result of the angled ridge 202 and angled flange 210, the speaker frame 104 can be adjusted to any angle within a range, e.g., zero degrees and a maximum angle, by rotating the speaker frame 104. This permits adjusting the sound dispersion axis 518 to any angle within the range. The maximum angle that can be achieved being dependent on the sum of the relative angle of the ridge and the relative angle of the flange.

By forming a groove or channel between the angled ridge 202 and the vertical wall 410, the speaker frame flange 210 is able to slide in this groove. In this manner, the speaker frame 104 can be rotated to direct the sound dispersion axis 518 of a speaker mounted thereon to a desired location within a room or environment. The ease with which the speaker frame 104 can be turned is adjusted by slightly increasing or reducing the size of the groove so as to create a looser or tighter fit with the flange 210. As previously noted, this can be accomplished by loosening or tightening the fasteners 411 to adjust the separation between the frame clamp's vertical wall 410 and baffle's angled ridge 202.

Figure 6:
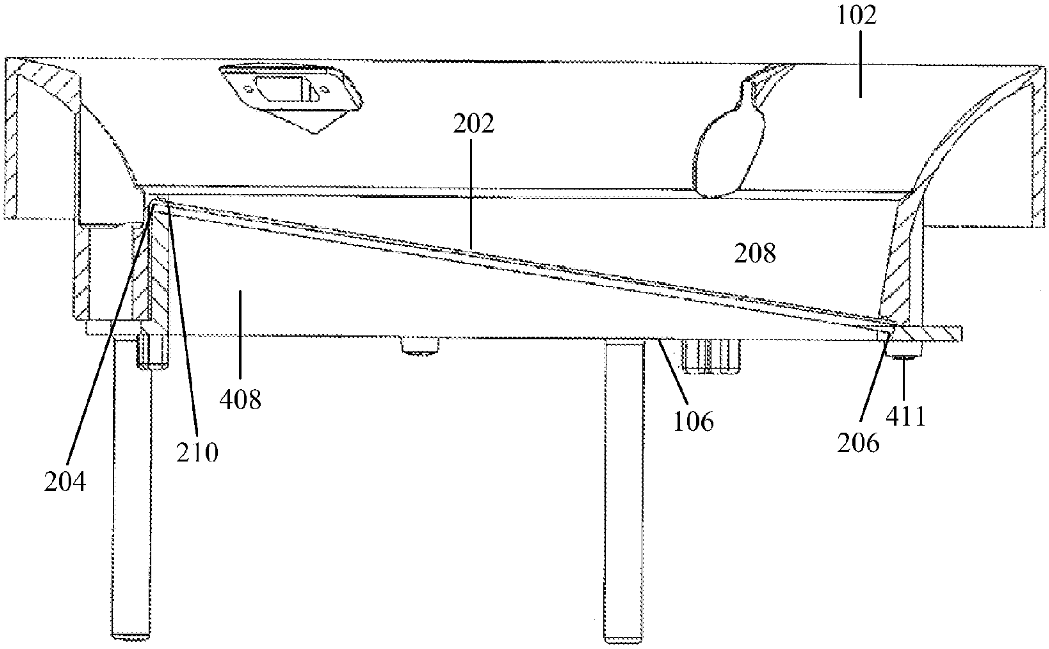
FIG. 6 illustrates a cross-sectional side view of the assembled speaker mounting assembly of FIG. 1 according to one embodiment of the invention.

FIG. 6 illustrates a cross-sectional side view of the assembled speaker mounting assembly of FIG. 1 according to one embodiment of the invention. As shown, the speaker frame clamp 106 is coupled to the baffle 102 using a plurality of fasteners 411. The speaker frame flange 210 is held be between the frame clamp's angled wall 410 and the baffle's ridge 202. The frame clamp 106 is positioned within the baffle 102 so that the angled wall 410 complements the angle of the ridge 202. This results in an evenly spaced groove for the speaker frame flange 210.

According to one implementation of the invention, the speaker frame 104 can rotate within the groove when the fasteners 411 are loosened slightly. Once adjusted to a desired position, the fasteners 411 are tightened, thereby reducing the size of the groove formed by the angled wall 410 and ridge 202, to prevent any further rotation of the speaker frame 104.

Another aspect of the invention provides a way to limit the rotation of the speaker frame 104. This prevents speaker wires from being torn or tangled if a speaker frame 104 is rotated many times in one direction.

Figure 7:
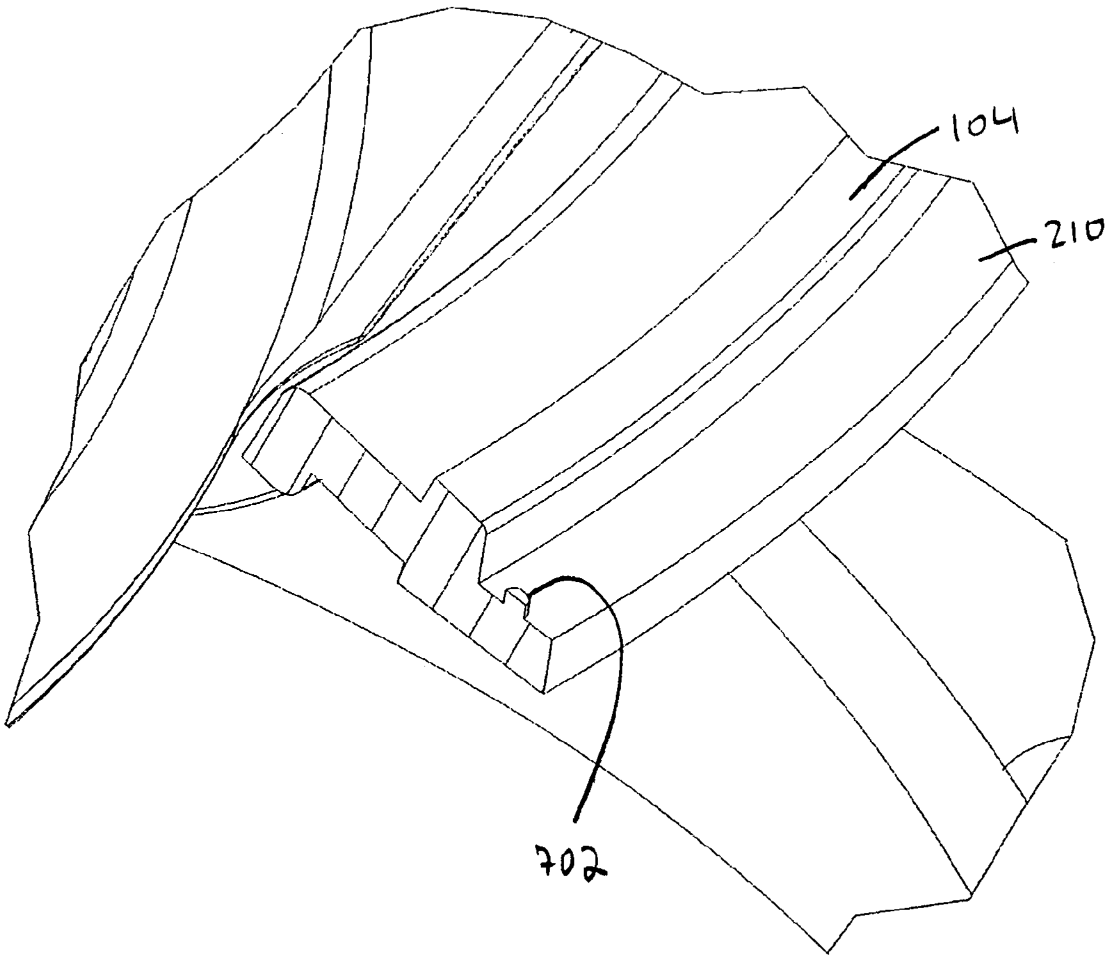
FIG. 7 illustrates a rotation stop pin for the speaker mounting assembly of FIG. 1 according to one embodiment of the invention.

FIG. 7 illustrates a rotation stop pin 702 for the speaker mounting assembly 100 of FIG. 1 according to one embodiment of the invention. The speaker frame 104 includes a stop pin 702 along the speaker frame flange 210. When the speaker mounting assembly 100 is assembled, the stop pin 702 limits the rotation of the speaker frame 104.

Figure 8:
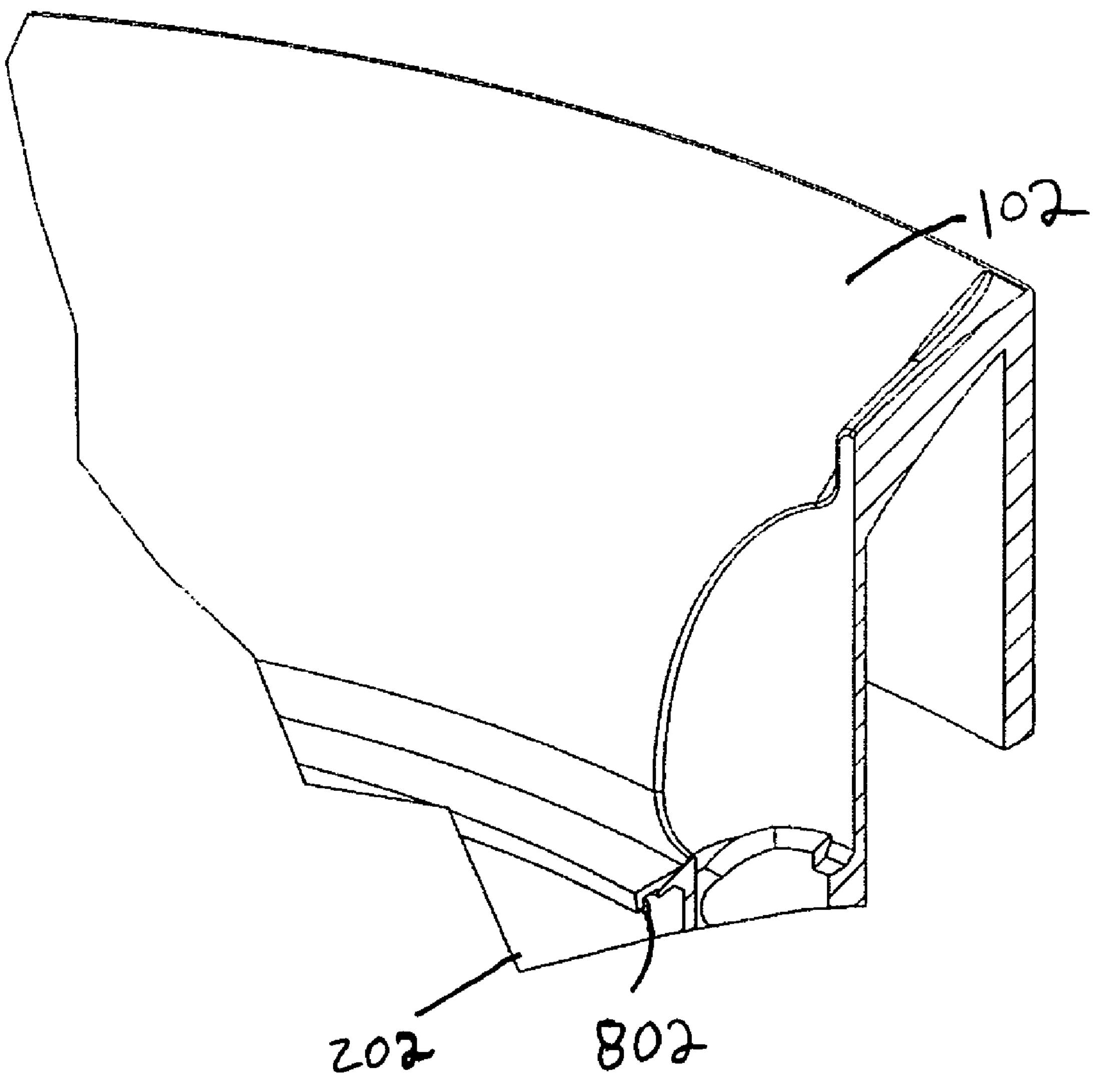
FIG. 8 illustrates a baffle having a groove along its ridge to accept a rotation stop pin according to one embodiment of the invention.

According to one implementation of the invention, illustrated in FIG. 8, the baffle's ridge 202 includes a groove 802 along a portion of the ridge 202 in which the stop pin 702 can ride. Thus, the length of the groove 802 in the ridge 202 limits the rotation of the speaker frame 104. For example, the groove 802 may run only half way along the circumference of the ridge 202 to limit the rotation of the speaker frame 104 to approximately one hundred eighty (180) degrees. Such groove 802 can be used to limit the rotation of the speaker frame 104 anywhere from zero (0) to three hundred and sixty (360) degrees.

In other implementations of the invention the stop pin is coupled to the speaker frame flange 210 and positioned facing the frame clamp 106. The groove may be part of the frame clamp 106. In yet another implementation of the invention, the stop pin may be directed toward a grooved channel in the vertical wall 208 of the baffle. In yet other embodiments, the grooved channel is part of the speaker frame 104 and engages a stop pin that is part of either the baffle 102 or frame clamp 106.

Figure 9:
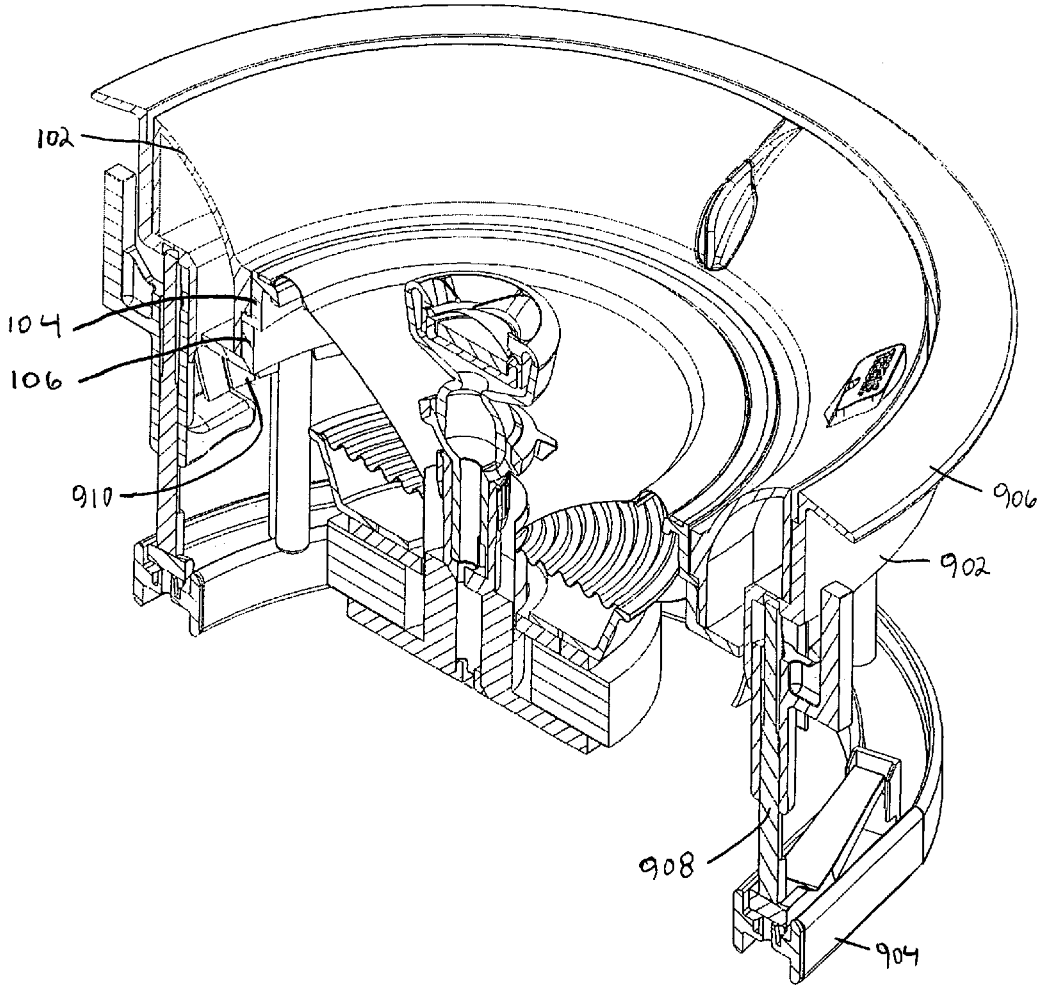
FIG. 9 illustrates a cross-sectional view of a tool-less fastening system in which the speaker mounting assembly of FIG. 1 may be inserted and secured according to one embodiment of the invention.

FIG. 9 illustrates a tool-less fastening system in which the speaker mounting assembly of FIG. 1 may be inserted and secured according to one embodiment of the invention. This fastening system does not require the use of hand-tools or power-tools for its installation, aside from a saw to cut the receiving hole or recess in the wall or ceiling.

The tool-less fastening system includes a primary mounting frame 902 and a retaining frame 904. According to one implementation of the invention, the primary mounting frame 902 is substantially circular and defines a cavity or opening through which a speaker baffle 102 may be mounted. The primary mounting frame 902 may include a border flange 906 that may serve as an external trim once the primary mounting frame 902 is mounted within a ceiling or wall recess. The primary mounting frame also includes a plurality of posts on which the retaining frame may be coupled by a pressure fit or one or more fasteners.

The primary mounting frame 902 may also include one or more ratcheting retainers or fasteners 908. Each ratcheting retainer 908 is movably coupled to the primary mounting frame 902. The retaining frame is coupled to one or more posts to secure the tool-less fasteners or retainers between the primary frame 902 and retaining frame 904. Each ratcheting retainer 908 is adapted to be manually rotated and slid to secure the primary mounting frame 902 to a mounting surface. The border flange 906 and the ratcheting retainers 908 sandwich the mounting surface to secure the primary mounting frame 902 to the mounting surface.

The primary frame 902 also includes a plurality of flexible fingers 910 that help to align and secure the baffle frame 102 that is inserted into the opening. The plurality of flexible fingers 910 are inclined or disposed toward the opening of the primary mounting frame 902.

The baffle frame 102 is configured to fit snug through the primary mounting frame opening. The fingers 910 on the primary frame 902 flex back as the baffle frame 102 is inserted into the opening.

According to one embodiment of the invention, the baffle frame 102 includes a plurality of fasteners that secure the baffle 102 to the primary mounting frame 902. The fasteners pass from the face of the baffle 102 to the rear of the baffle to secure the baffle to the primary mounting frame 902. The fasteners can be manually rotated to slide a securing foot over the retaining fingers 910 and secure the baffle 102 in place.

Even when the fasteners secure the baffle 102 to the primary mounting frame 902, the baffle frame 102 can freely rotate three hundred and sixty degrees as the fastener footings slide over the retaining fingers 910. This permits two ways in which to adjust the sound dispersion axis of a speaker mounted in a speaker frame within the baffle 102.

First, as previously discussed, the speaker frame 104 can be rotated to adjust the angle of the sound dispersion axis of a speaker, or any other sound transducer device, mounted therein. The rotation of the speaker frame 104 relative to the baffle causes the angle of the speaker 104 to change within a certain range of angles, thus changing the angle of the sound dispersion axis of the speaker relative to the mounting surface.

Secondly, once the dispersion angle has been adjusted, the baffle 102 can be rotated relative to the primary mounting frame 902 to adjust the direction of the sound dispersion axis. Thus, sound from a speaker can be directed to a desired location within a room.

By using the angle and direction adjusting speaker frame described, a plurality of recessed speakers can be easily and quickly arranged to provide a desired sound quality in a room. For instance, a plurality of speakers may be adjusted to direct sound to a particular location in a room thus improving the sound quality at that location.

Various embodiments of the invention may be implemented using parts, fasteners, frames, baffles, etc., constructed from one or more materials, or combination of material, including plastic, metal, polymers, and/or any other material.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications are possible. Those skilled, in the art will appreciate that various adaptations and modifications of the just described embodiments can be configured without departing from the scope and spirit of the invention. Therefore, it is to be understood that, within the scope of the appended claims, the invention may be practiced other than as specifically described herein.

What is claimed is:

1. A speaker mounting assembly comprising:

a speaker frame defining a housing to receive a speaker, the speaker frame defining a first plane along the face of the speaker frame, the speaker frame including a flange around the perimeter of the speaker frame, the flange defining a second plane that is at an angle to the first plane;

a baffle defining an interior opening to receive the speaker frame, the baffle defining a third plane along the face of the baffle, the baffle including an angled ridge along the perimeter of the interior opening, the ridge defining a fourth plane that is at an angle to the third plane, the ridge defining a perimeter that is smaller than the perimeter defined by the flange, the ridge to support the flange when the speaker frame is coupled to the baffle; and a clamp frame coupled to the baffle to secure the speaker frame between the baffle and the clamp frame while permitting the speaker frame to rotate about a first axis perpendicular to the first plane, the angle of the first plane of the speaker frame, relative to the third plane of the baffle, being adjustable within a range by rotating the speaker frame about the first axis;

wherein the speaker frame can be rotated relative to the baffle to direct the first axis to a given location in a room.

2. The speaker mounting assembly of claim 1 wherein a groove is formed by the clamp frame and the ridge when the clamp is coupled to the baffle, the flange slides within this groove when the speaker frame is rotated about the first axis.

3. The speaker mounting assembly of claim 1 further comprising: a stop pin coupled to the flange, wherein the baffle further includes a grooved channel along a first section defining the interior opening, the grooved channel to receive the stop pin and limit the rotation of the speaker frame to the first section.

4. The speaker mounting assembly of claim 1 further comprising a stop pin coupled to the baffle, wherein the speaker frame further includes a grooved channel that engages the stop pin and limits the rotation of the speaker frame.

5. The speaker mounting assembly of claim 1 wherein the speaker frame assembly is capable of being adjusted to any angle, relative to the third plane of the baffle, between a minimum angle and a maximum angle by rotating the speaker frame assembly about the first axis.

6. The speaker mounting assembly of claim 1 wherein minimum angle is approximately zero degrees and the maximum angle is approximately eighteen degrees.

7. The speaker mounting assembly of claim 1, wherein the angle of the speaker frame is adjustable while the speaker is mounted within the speaker frame.

8. A recessed speaker arrangement comprising:

a mounting assembly secured within a recessed ceiling or wall cavity of a room;

a baffle secured to the mounting assembly and defining an interior opening to receive the speaker frame, the baffle defining a first plane along the face of the baffle, the baffle including a ridge along the perimeter of the interior opening, the ridge defining a second plane at an angle to the first plane;

a speaker frame defining a housing and rotationally coupled to the baffle, the speaker frame defining a third plane along the face of the speaker frame, the speaker frame including an angled flange around the perimeter of the speaker frame, the flange defining a fourth plane that is at an angle to the third plane, the flange supported by the ridge of the baffle; and a first speaker secured to the speaker frame, the first speaker having a sound dispersion axis substantially perpendicular to the third plane of the of the speaker frame, wherein the sound dispersion axis can be directed to a desired location in the room by rotating the speaker frame about the sound dispersion axis so that the angled flange rides on the angled ridge thereby changing the angle of the third plane, relative to the first plane, as the speaker frame is rotated;

wherein the speaker frame can be adjusted to any angle between a minimum angle and a maximum angle by rotating it about the sound dispersion axis.

9. The recessed speaker arrangement of claim 8 wherein the maximum angle is defined by the angle of the ridge and the angle of the flange.

10. The recessed speaker arrangement of claim 8 further comprising: a clamp frame coupled to the baffle and securing the speaker frame between the baffle and the clamp frame while permitting the speaker frame to rotate about the sound dispersion axis.

11. The recessed speaker arrangement of claim 8 further comprising: a stop pin coupled to the flange, wherein the baffle further includes a grooved channel along a first section, the grooved channel to receive the stop pin and limit the rotation of the speaker frame to the first section.

12. The recessed speaker arrangement of claim 8, wherein the angle of the speaker frame is adjustable while the speaker is mounted within the speaker frame.

13. A speaker frame comprising:

a housing to secure a speaker;

an outer perimeter ring defining an opening on a first surface of the housing to permit mounting a speaker therein, the outer perimeter ring defining a first plane; and a flange extending along the outer perimeter of the speaker frame and defining a second plane, the second plane being at a first angle to the first plane, the angle of a sound dispersion axis of a speaker mounted in the speaker frame, relative to a mounting surface, being adjustable to any angle within a range of angles by rotating the flange against another angled surface;

wherein the speaker frame can be rotated relative to a baffle that defines an interior opening to receive the speaker frame to direct the first axis to a given location in a room, and where the angle of dispersion of the speaker relative to the baffle is adjustable while the speaker is mounted within the speaker frame.

14. The speaker frame of claim 13 wherein the range of angles that the sound dispersion axis can be adjusted is between zero degrees and the sum of the first angle and the angle of the surface on which the flange is rotated.

15. The speaker frame of claim 13 wherein the speaker frame is configured to be mounted within a baffle frame and the angled flange is disposed against an angled ridge of the baffle frame.

16. The speaker frame of claim 13 further comprising: a stop pin coupled to the flange, the stop pin to limit the amount by which the speaker frame can be rotated.

* * * * *